United States Patent
Yokota et al.

(10) Patent No.: US 6,913,302 B2
(45) Date of Patent: Jul. 5, 2005

(54) ROBOT ARM EDGE GRIPPING DEVICE FOR HANDLING SUBSTRATES

(75) Inventors: Chuckson Yokota, Fremont, CA (US); Joseph Mann, San Jose, CA (US); Jean-Pascal Rouland, Fremont, CA (US); Malek Charif, San Jose, CA (US); Ted Hwang, Mountain View, CA (US)

(73) Assignee: PRI Automation, Inc., Chelmsford, MA (US)

( * ) Notice: Subject to any disclaimer, the term of this patent is extended or adjusted under 35 U.S.C. 154(b) by 0 days.

(21) Appl. No.: 10/121,152

(22) Filed: Apr. 11, 2002

(65) Prior Publication Data

US 2003/0133780 A1 Jul. 17, 2003

(Under 37 CFR 1.47)

Related U.S. Application Data

(60) Provisional application No. 60/283,521, filed on Apr. 11, 2001.

(51) Int. Cl.[7] .................................................. B66C 1/42
(52) U.S. Cl. ................. 294/103.1; 294/907; 414/744.8; 901/39
(58) Field of Search ......................... 414/744.3, 744.8, 414/744.5, 739, 740, 741; 901/39; 294/103.1, 104, 907

(56) References Cited

U.S. PATENT DOCUMENTS

| | | | |
|---|---|---|---|
| 3,807,029 A | 4/1974 | Troeger | 29/436 |
| 3,811,665 A | 5/1974 | Seelig | 267/160 |
| 3,813,089 A | 5/1974 | Troeger | 267/160 |
| 3,825,992 A | 7/1974 | Troeger | 29/436 |
| 4,639,028 A * | 1/1987 | Olson | 294/103.1 X |
| 6,283,701 B1 * | 9/2001 | Sundar et al. | 414/744.5 |

OTHER PUBLICATIONS

US 6,227,585, 5/2001, Govzman et al. (withdrawn)*

* cited by examiner

*Primary Examiner*—Donald W. Underwood
(74) *Attorney, Agent, or Firm*—Weingarten, Schurgin, Gagnebin & Lebovici LLP; Richard Pickreign

(57) ABSTRACT

An edge gripping device grips and ungrips a substrate, such as a semiconductor wafer. A blade extends in a distal direction from a base of the device. At least one distal contact member is provided at the tip of the blade. Two proximal lever arms are pivotally coupled for synchronized, oppositely directed rotation to the base. Each lever arm has at least one proximal contact member at an outer end. A biasing member is coupled to the two proximal lever arms and to an actuator to effect pivoting movement of the lever arms. The pivoting motion moves the ends of the arms generally radially toward and away from the center of the substrate to be gripped or ungripped, thereby minimizing sliding of the substrate. The biasing member is biased to retain the lever arms in a closed position in the event of a power failure. Ramps are provided next to each contact member. The contact members and ramps are profiled to minimize the zone of the substrate edge that is contacted. The lever arms are pivotally mounted with flexural pivot members having no sliding motion, to minimize particle generation.

39 Claims, 3 Drawing Sheets

ROBOT ARM EDGE GRIPPING DEVICE FOR HANDLING SUBSTRATES

CROSS REFERENCE TO RELATED APPLICATIONS

This application claims priority under 35 U. S. C. § 119(e) of U.S. Provisional Application No. 60/283,521, filed Apr. 11, 2001, the disclosure of which is incorporated by reference herein.

STATEMENT REGARDING FEDERALLY SPONSORED RESEARCH OR DEVELOPMENT

N/A

BACKGROUND OF THE INVENTION

In semiconductor fabrication, circuits are formed on wafers of a semiconductor material such as silicon. A single crystal of the semiconductor material is sliced into thin wafers and the wafers are transported between various stations, such as processing stations, storage stations, or queuing stations, in the fabrication plant. The fabrication plant must be kept clean to prevent contamination of the semiconductor wafers. The wafers are accordingly handled very carefully in sealed cleanroom environments.

Robots are often used to transport the wafers between processing, storage, queuing or other stations. A typical robot includes an arm movable vertically and in a horizontal plane. An end effector on the end of the arm picks up and places the wafer. The end effector may include a mechanism for holding onto the wafer to prevent the wafer from slipping or otherwise becoming damaged while the robot arm is carrying it.

In certain semiconductor applications, the wafer includes an alignment feature, such as a notch or flat, along one edge that is used to align the wafer in a desired orientation prior to delivering the wafer to a processing station. A pre-aligner device is often used to accomplish this alignment. Before delivering the wafer to the processing station, the robot arm deposits the wafer at the pre-aligner device, which rotates the wafer until the notch or flat is properly oriented. The robot arm then picks the wafer up again, in the proper orientation, and delivers the wafer to the processing station.

SUMMARY OF THE INVENTION

The present invention relates to an edge gripping device for a robot that grips the edges of a substrate, such as a semiconductor wafer. The edge gripping device provides proximal and distal points of substrate contact. The proximal points of contact move in synchronized motion toward a substrate to grip it and away from the substrate to ungrip it. The motion is achieved via two proximal lever arms coupled with a biasing member for synchronized rotation along a generally radial trajectory toward and away from the substrate's center. The biasing member biases the lever arms into a gripping position if power is lost.

More particularly, the edge gripping device includes a base that is mountable, for example, to a robot arm assembly. A blade extends in a distal direction from the base and has at least one distal contact member at a distal location. Two proximal lever arms are coupled for synchronized, oppositely directed rotation to the base. Each lever arm has at least one proximal contact member at an outer end. An actuator is fixed to the base and is operatively coupled to the two lever arms via a symmetrically disposed biasing member, such as a resilient element or leaf spring, to effect the synchronized pivoting movement of the proximal contact members.

The edge gripping device of the present invention eliminates the need for separate actuators to move both proximal contacts. The synchronized, radial motion of the lever arms is able to provide centering of the substrate on the device, in some cases eliminating the need for a pre-aligner device. The device is able to accommodate substrates that are slightly off center on their supports or slightly warped. The edge exclusion, the zone of contact along the substrate's edge, is minimized, for example to less than 1 mm for semiconductor wafers. The lever arms are mounted using flexural pivot members that have no sliding motion, thereby minimizing particle generation.

DESCRIPTION OF THE DRAWINGS

The invention will be more fully understood from the following detailed description taken in conjunction with the accompanying drawings in which.

DETAILED DESCRIPTION OF THE INVENTION

Figure 1:
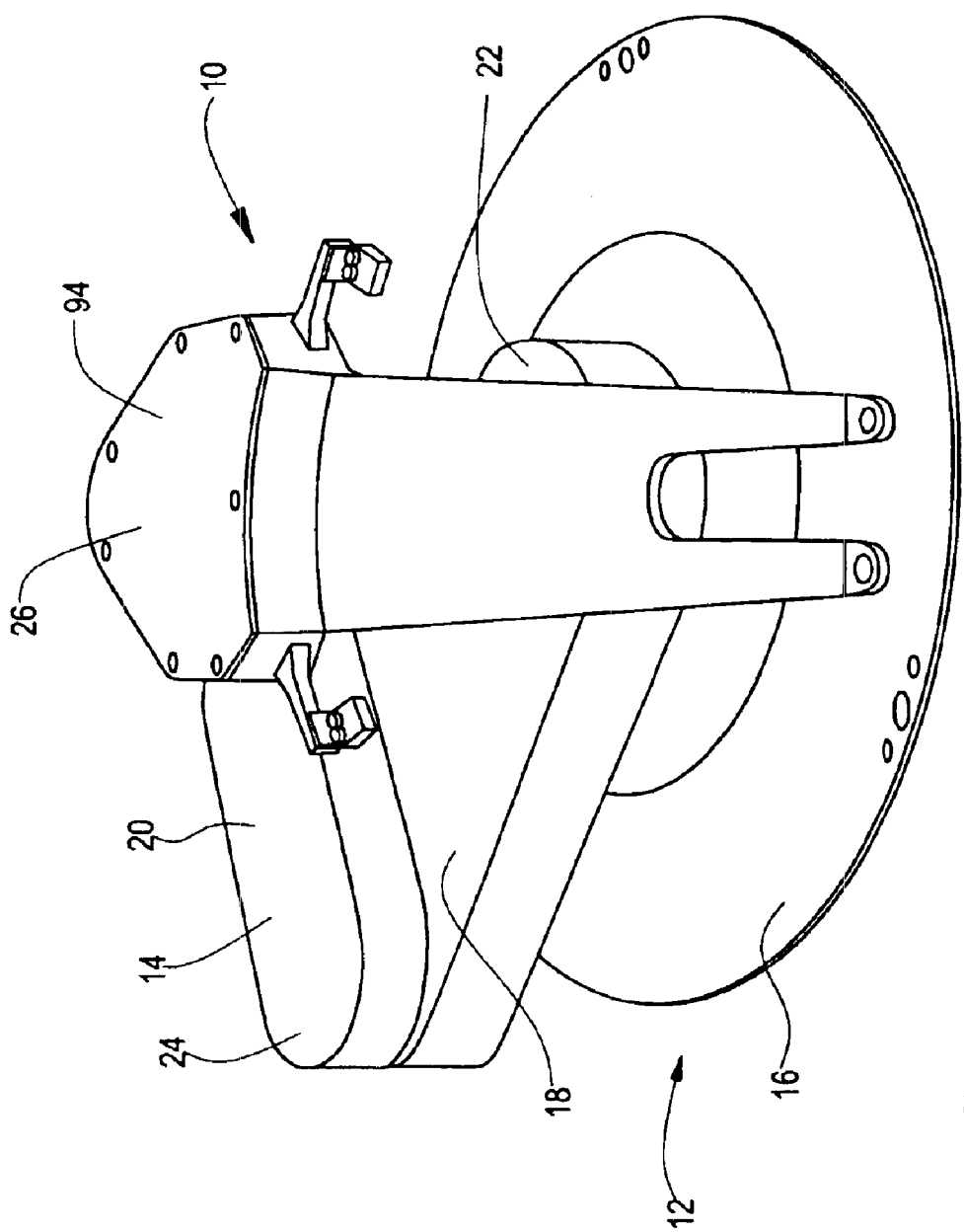
FIG. 1 is a perspective view of a robot arm with an edge gripping device according to the present invention.

An edge gripping device 10 according to the present invention is illustrated in FIG. 1 in conjunction with a typical robot arm assembly 12. The robot arm assembly includes an arm 14 mounted on a support 16, such as a central column that houses a lifting mechanism (not shown) to raise and lower the arm vertically. The central column is rotatably mounted to turn the arm to a desired direction within the limits of its travel. The arm includes an inner arm 18, an outer arm 20, and the edge gripping device 10, which may also be referred to as an end effector. The inner arm is supported by the central column at a rotatable "shoulder" joint 22 to effect rotation about a vertical axis through the central column. Similarly, the outer arm is mounted to the inner arm at a rotatable "elbow" joint 24 for rotation about a vertical axis, and the edge gripping device is mounted to the outer arm at a rotatable "wrist" joint 26 for rotation about a vertical axis. The shoulder, elbow, and wrist joints are coordinated via suitable timing belts and pulleys to produce a straight-line radial translation of the end effector. It will be appreciated that the edge gripping device of the present invention can be used with other robotic arm configurations.

Figure 2:
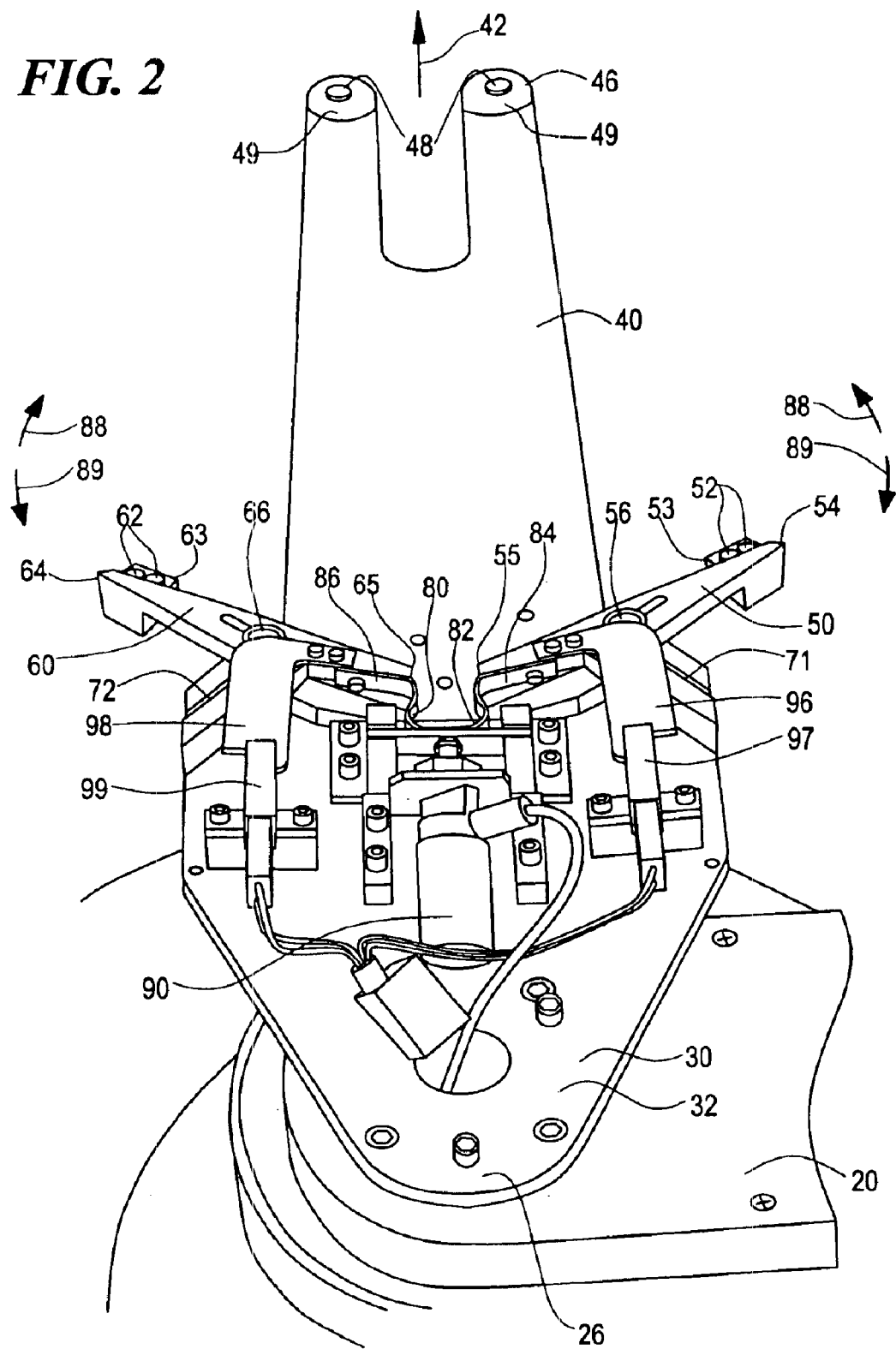
FIG. 2 is a perspective view of a first embodiment of the edge gripping device of the present invention.
Figure 3:
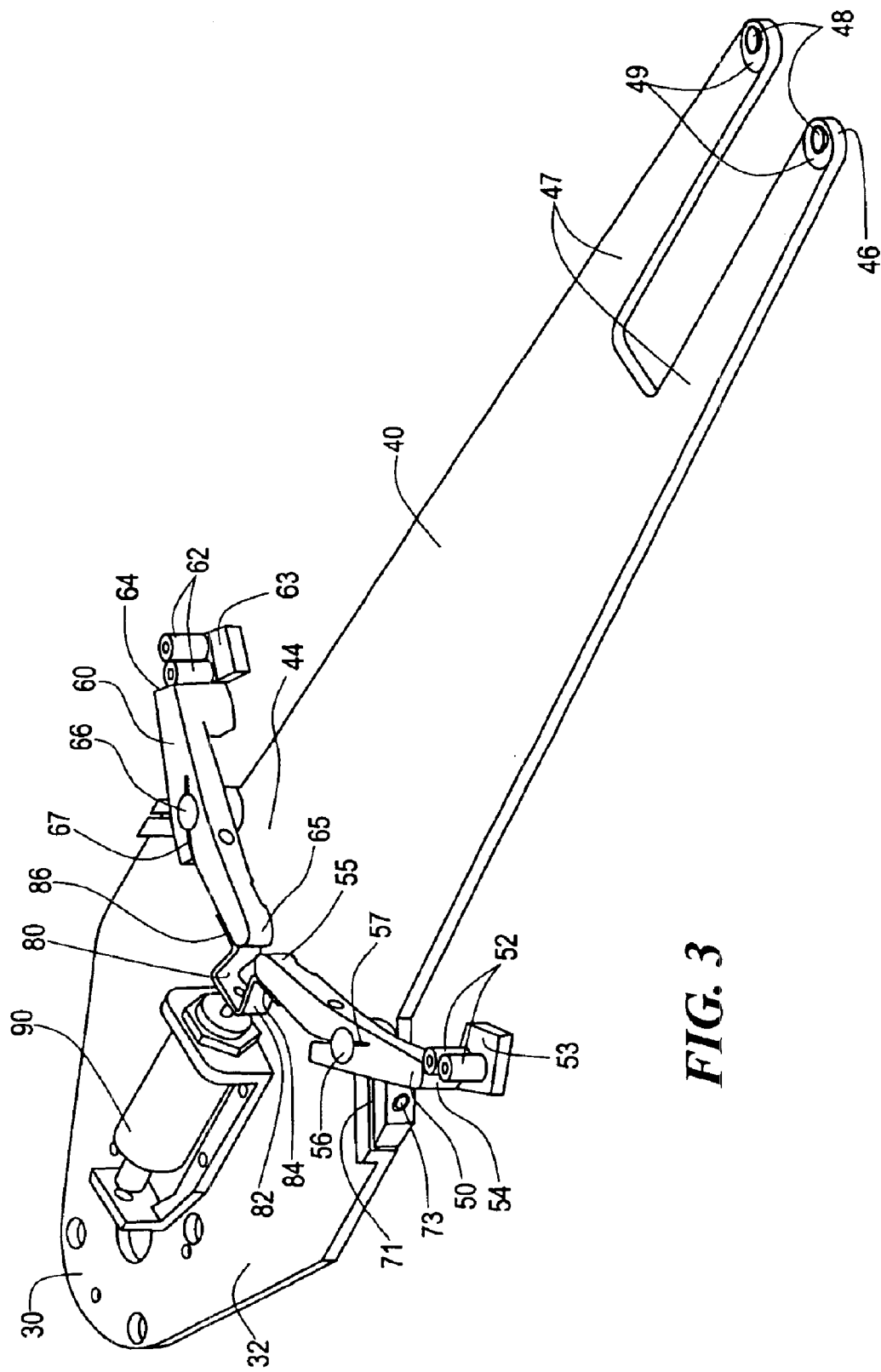
FIG. 3 is a perspective view of a further embodiment of the edge gripping device of the present invention.

FIGS. 2 and 3 show with more particularity embodiments of the edge gripping device 10 of the present invention. These figures illustrate design differences within the skill of those in the art, for example, in the mounting details of various components. In these figures, like reference numerals are used to refer to like elements.

Referring to FIGS. 2 and 3, the edge gripping device 10 includes a base 30 having a wrist portion 32 mounted at the wrist joint 26 to the robot outer arm 20. The base also includes a blade 40 extending from the wrist portion in a distal direction, indicated by arrow 42. Two lever arms 50, 60 are pivotally mounted to the base near a proximal region 44 of the blade. For purposes of describing the present invention, the term "distal" is a relative term that refers to the direction away from the wrist joint 26, toward the blade tip 46. The term "proximal" is a relative term that refers to the direction toward the wrist joint 26. The base is mounted to the robot outer arm such that the distal and proximal directions coincide with the direction of radial motion.

Substrate edge contact members 48, 52, 62, such as pins, are provided at the distal tip of the blade 40 and at the ends of the two lever arms 50, 60 to provide locations or points of contact for gripping an edge of a substrate. Preferably, at least three contact locations are provided. The contact points may have any suitable configuration, such as pins having a cylindrical or tapered or conical shape. Adjacent each contact pin, a ramp or inclined surface 49, 53, 63 is provided. For semiconductor processing applications, the contact pins and ramps are made from a non-conductive cleanroom-compatible plastic.

The contact pins and ramps are profiled to minimize the zone around the circumference of the substrate that is contacted by the edge gripping device, also called the edge exclusion. For example, in the semiconductor wafer processing industry, the edge exclusion must be no greater than 3 mm. The present invention minimizes the edge exclusion to a maximum of 1 mm.

The blade 40 is configured to extend beneath a substrate, such as a semiconductor wafer in a stack of wafers. The blade may be optimized for minimal deflection, for example, by tapering the thickness of the blade from the wrist or proximal region 44 to the tip 46, as can be readily determined by one of skill in the art. At the distal tip of the blade, at least one and preferably two contact pins 48 and associated ramps 49 are provided. In the embodiment shown, the tip of the blade is forked, which allows the edge gripping device to accommodate a pre-aligner device, and a contact pin and ramp are provided on the end of each tine 47 of the fork. It will be appreciated that the tip need not be forked if a pre-aligner device is not used; in this case, a single pin or two abutting or closely spaced pins at the tip of the blade may be sufficient.

At the outer end 54, 64 of each lever arm 50, 60, at least one and preferably two contact pins 52, 62 are provided at each contact location. The pins at each end are abutting or closely spaced, because certain substrates such as semiconductor wafers include an alignment feature in the form of a notch. If a single pin were used at each location, one pin could potentially move into the notch during closure and shift the wafer out of the proper position on the edge gripping device. By providing two pins at each location, at least one pin cannot move into the notch, thereby preventing the wafer from shifting on the edge gripping device. In a similar manner, preferably two pins 48 are placed at the tip 46 of the blade 40. Although not abutting in the embodiment shown in FIGS. 2 and 3, the two pins at the tip of each tine 47 are sufficiently close such that at least one pin cannot move into the notch. Some substrates may include a flat as an alignment feature rather than a notch. It will be appreciated that to accommodate a flat, one or more contact members that provide a sufficiently long curved edge or a number of contact points may be used.

Each lever arm 50, 60 is pivotally mounted to the base 30 at a pivot point 56, 66 near the proximal region 44 of the blade 40. The pivot points are located intermediate the outer ends 54, 64 and the inner ends 55, 65 of the lever arms. The pivoting motion moves the ends of the arms generally radially toward the center of the substrate, which provides an automatic centering of the substrate between the contact members and minimizes sliding of the substrate during gripping. Preferably, the pivot points are formed by flexural pivots that have no sliding motion that could generate particles. Suitable flexural pivots are commercially available, for example, from Lucas Aerospace Power Transmission in Utica, N.Y. The flexural pivots are contained within suitable openings formed in each lever arm and in the base near the proximal end of the blade. Slots 57, 67, 71, 72 connecting with the openings are provided within each arm and in the base, and screws 73 (only one shown for clarity) extend through aligned threaded holes, traversing the slots, to clamp and allow adjustment of the flexural pivots. Other types of pivots, such as shaft and bearing pivots, may be used, particularly if particle generation were not a concern or if the mechanism were enclosed.

The lever arms 50, 60 are interconnected at their inner ends 55, 65 by a biasing member 80. In the embodiment shown, the biasing member is a resilient element such as a leaf spring. The spring has a U-shaped or double-serpentine shaped midportion 82 and two extending arms 84, 86. One extending arm is affixed to each lever arm in any suitable manner, such as with a screw or pin. The spring biases the two lever arms to a closed position with the outer ends biased toward each other, indicated by the arrows 88 (FIG. 2). The midportion 82 of the spring is fixedly connected in any suitable manner to an actuator 90 mounted to the base, so that the midportion is movable with the actuator. The actuator may be of any suitable type, such as a solenoid, a pneumatic linear or rotary actuator, a vacuum actuator, or a motor. When it is desired to open the lever arms 50, 60, the actuator 90 pushes the midportion 82 of the spring in the distal direction indicated by the arrow 42, which moves the spring arms apart. The motion of the spring arms in turn causes the two lever arms 50, 60 to pivot in synchronization about the pivot points 56, 66 to move the outer ends 54, 64 apart in the direction indicted by the arrows 89 (FIG. 2). When the actuator is deactivated or in the event or a power failure or loss of vacuum to the actuator, the spring biases the lever arms into the closed position, thus ensuring that the substrate remains gripped.

The gripping speed and impact force may be suitably controlled to control impact forces on the substrate. For example, by controlling the exhaust of a vacuum actuator through a suitably sized orifice, the gripping speed is reduced as the pins contact the substrate. As the lever arms move only as the spring overcomes the decreasing vacuum, the force at any instant is balanced between the spring and the vacuum. Thus, the force at impact is low, then builds up as the decreasing vacuum allows the spring to exert more force on the substrate.

Portions of the edge gripping device are enclosed by a suitable cover 94 (FIG. 1) after installation to prevent injury to operating personnel and to prevent any contaminants that might be generated from contacting the substrate.

One or more sensors are provided to detect whether the edge gripping device is in an open, closed, or over-traveled closed position. In the embodiment illustrated, a first flag 96 extends from one of the lever arms to an associated detector 97. In an open or over-traveled closed position, the flag occludes a light path in the detector. In the closed position, a slit in the flag prevents occlusion of the light path. A second flag 98 extends from the other lever arm. In the closed or over-traveled closed position, a portion of the flag occludes the light path in the associated detector 99. It will be appreciated that a single sensor, or three or more sensors, may be provided. Similarly, other types of sensors may be provided.

In operation, the robot arm moves the edge gripping device 10 beneath a substrate to be gripped with the actuator activated to hold the lever arms 50, 60 open. The robot arm under the control of a suitable controller (not shown) is able to locate the edge gripping device sufficiently accurately beneath the substrate, for example, by learning the configuration of a substrate at a particular station during installation, as is known in the art. The robot arm then raises the edge gripping device vertically until the edges of the substrate contact the ramps. As the edge gripping device continues rising vertically, the substrate lifts off the supports upon which it is resting. Once the substrate is fully supported by the ramps of the edge gripping device, the actuator is deactivated to allow the lever arms to close. The pins on each of the lever arms contact the edges of the substrate and push the substrate into contact with the pins at the tip. When the substrate is firmly gripped, the robot arm transfers the substrate to an appropriate destination.

Although the robot arm learns the general location of the substrates to be picked up from a known source, the substrates may be offset slightly on their supports or may be slightly warped. The edge gripping device is able to automatically center a substrate on the edge gripping device even if the substrate is slightly offset or warped. Preferably, the edge gripping device is able to center substrates such as semiconductor wafers that are offset within a 4.0 mm diameter tolerance zone, which is suitable for most 300 mm semiconductor wafer handling applications.

The invention is not to be limited by what has been particularly shown and described, except as indicated by the appended claims.

What is claimed is:

1. An edge gripping device for gripping and ungripping a substrate comprising:
    a base
    a blade extending in a distal direction from the base and having at least one distal contact member at a distal location;
    two proximal lever arms coupled for synchronized, oppositely directed rotation to the base, each lever arm having at least two proximal contact members at an outer end; and
    an actuator fixed to the base and operatively coupled to the two lever arms to effect pivoting movement of the proximal contact members.

2. The edge gripping device of claim 1, wherein the two proximal contact members at the end of each lever arm are abutting.

3. The edge gripping device of claim 1, further comprising a biasing member coupled to the two proximal lever arms to bias the lever arms into a closed position, and the actuator is coupled to the biasing member to effect pivoting movement of the two lever arms.

4. The edge gripping device of claim 1, wherein each lever arm is pivotally mounted to the base at an interior point between an inner end and an outer end.

5. The edge gripping device of claim 3, wherein the biasing member comprises a resilient element comprising a midportion and two ends, the two ends fixed to respective inner ends of the lever arms, the midportion fixed to the actuator for movement therewith.

6. The edge gripping device of claim 1, wherein the two proximal lever arms are mounted to the base with flexural pivot members.

7. The edge gripping device of claim 1, further comprising a ramp adjacent the distal contact member and a ramp adjacent the proximal contact member of each lever arm.

8. The edge gripping device of claim 7, wherein the distal and proximal contact members and the ramps are formed of a cleanroom compatible material.

9. The edge gripping device of claim 1, wherein the blade has two distal contact members at the distal location.

10. The edge gripping device of claim 9, wherein the blade includes a pair of tines at the distal end and the two distal contact members are located on associated ones of the pair of tines.

11. The edge gripping device of claim 1, further comprising a sensor disposed to detect a closed position and an open position.

12. The edge gripping device of claim 1, wherein the actuator is operative to control forces of the proximal contact member on the substrate.

13. An edge gripping device for gripping and ungripping a substrate comprising:
    a base;
    a blade extending in a distal direction from the base and having at least one distal contact member at a distal location, wherein the blade is tapered in thickness in the distal direction;
    two proximal lever arms coupled for synchronized, oppositely directed rotation to the base, each lever arm having at least one proximal contact member at an outer end; and
    an actuator fixed to the base and operatively coupled to the two lever arms to effect pivoting movement of the proximal contact members.

14. The edge gripping device of claim 13, further comprising a biasing member coupled to the two proximal lever arms to bias the lever arms into a closed position, and the actuator is coupled to the biasing member to effect pivoting movement of the two lever arms.

15. The edge gripping device of claim 14, wherein the biasing member comprises a resilient element comprising a midportion and two ends, the two ends fixed to respective inner ends of the lever arms, the midportion fixed to the actuator for movement therewith.

16. The edge gripping device of claim 13, wherein each lever arm is pivotally mounted to the base at an interior point between an inner end and an outer end.

17. The edge gripping device of claim 13, wherein the two proximal lever arms are mounted to the base with flexural pivot members.

18. The edge gripping device of claim 13, further comprising a ramp adjacent the distal contact member and a ramp adjacent the proximal contact member of each lever arm.

19. The edge gripping device of claim 18, wherein the distal and proximal contact members and the ramps are formed of a cleanroom compatible material.

20. The edge gripping device of claim 13, wherein each of the proximal lever has two proximal contact members at the end.

21. The edge gripping device of claim 20, wherein the two proximal contact members at the end of each lever arm are abutting.

22. The edge gripping device of claim 13, wherein the blade two distal contact members at the distal location.

23. The edge gripping device of claim 22, wherein the blade includes a pair of tines at the distal end and the two distal contact members are located on associated ones of the pair of tines.

24. The edge gripping device of claim 13, further comprising a sensor disposed to detect a closed position and an open position.

25. The edge gripping device of claim 13, further comprising a sensor disposed to detect an over-traveled closed position.

26. The edge gripping device of claim 13, wherein the actuator is operative to control forces of the proximal contact member on the substrate.

27. An edge gripping device for gripping and ungripping a substrate comprising:
- a base;
- a blade extending in a distal direction from the base and having at least one distal contact member at a distal location,
- two proximal lever arms coupled for synchronized, oppositely directed rotation to the base, each lever arm having at least one proximal contact member at an outer end;
- an actuator fixed to the base and operatively coupled to the two lever arms to effect pivoting movement of the proximal contact members; and
- a sensor disposed to detect an over-traveled closed position.

28. The edge gripping device of claim 27, further comprising a biasing member coupled to the two proximal lever arms to bias the lever arms into a closed position, and the actuator is coupled to the biasing member to effect pivoting movement of the two lever arms.

29. The edge gripping device of claim 28, wherein the biasing member comprises a resilient element comprising a midportion and two ends, the two ends fixed to respective inner ends of the level arms, the midportion fixed to the actuator for movement therewith.

30. The edge gripping device of claim 27, wherein each lever arm is pivotally mounted to the base at an interior point between an inner end and an outer end.

31. The edge gripping device of claim 27, wherein the two proximal lever arms are mounted to the base with flexural pivot members.

32. The edge gripping device of claim 27, further comprising a ramp adjacent the distal contact member and a ramp adjacent the proximal contact member of each lever arm.

33. The edge gripping device of claim 32, wherein the distal end proximal contact members and the ramps are formed of a cleanroom compatible material.

34. The edge gripping device of claim 27, wherein each of the proximal lever arms has two proximal contact members at the end.

35. The edge gripping device of claim 34, wherein the two proximal contact members at the end of each lever arm are abutting.

36. The edge gripping device of claim 27, wherein the blade has two distal contact members at the distal location.

37. The edge gripping device of claim 36, wherein the blade includes a pair of tines at the distal end and the two distal contact members are located on associated ones of the pair of tines.

38. The edge gripping device of claim 27, further comprising a sensor disposed to detect a closed position and an open position.

39. The edge gripping device of claim 27, wherein the actuator is operative to control forces of the proximal contact member on the substrate.

* * * * *

UNITED STATES PATENT AND TRADEMARK OFFICE
CERTIFICATE OF CORRECTION

| | | |
|---|---|---|
| PATENT NO. | : 6,913,302 B2 | Page 1 of 1 |
| APPLICATION NO. | : 10/121152 | |
| DATED | : July 5, 2005 | |
| INVENTOR(S) | : Chuckson Yokota et al. | |

It is certified that error appears in the above-identified patent and that said Letters Patent is hereby corrected as shown below:

Column 6, claim 20, line 48, "lever has" should read --lever arms has--;

Column 6, claim 22, line 54, "blade two" should read --blade has two--; and

Column 8, claim 33, line 9, "end" should read --and--.

Signed and Sealed this

Seventh Day of November, 2006

JON W. DUDAS
*Director of the United States Patent and Trademark Office*